US012569803B2

(12) United States Patent
Yoon

(10) Patent No.: US 12,569,803 B2
(45) Date of Patent: Mar. 10, 2026

(54) DEVICE FOR TREATING SEMICONDUCTOR PROCESS EXHAUST GAS

(71) Applicant: PLASMA SCIENCE SYSTEM CO., LTD., Hwaseong-si (KR)

(72) Inventor: Jong Pil Yoon, Cheonan-si (KR)

(73) Assignee: PLASMA SCIENCE SYSTEM CO., LTD. (KR)

( * ) Notice: Subject to any disclaimer, the term of this patent is extended or adjusted under 35 U.S.C. 154(b) by 400 days.

(21) Appl. No.: 18/195,360

(22) Filed: May 9, 2023

(65) Prior Publication Data

US 2023/0271133 A1      Aug. 31, 2023

Related U.S. Application Data

(63) Continuation of application No. PCT/KR2022/005650, filed on Apr. 20, 2022.

(30) Foreign Application Priority Data

Apr. 21, 2021      (KR) ........................ 10-2021-0051514

(51) Int. Cl.
| | |
|---|---|
| *B01D 53/32* | (2006.01) |
| *B01D 53/68* | (2006.01) |
| *H01L 21/67* | (2006.01) |

(52) U.S. Cl.
CPC ............. *B01D 53/32* (2013.01); *B01D 53/68* (2013.01); *H01L 21/67017* (2013.01); *B01D 2257/204* (2013.01); *B01D 2257/406* (2013.01); *B01D 2258/0216* (2013.01); *B01D 2259/818* (2013.01)

(58) Field of Classification Search
CPC .. B01D 53/32; B01D 53/68; B01D 2257/204; B01D 2257/406; B01D 2258/0216; B01D 2259/818; H01L 21/67017
See application file for complete search history.

(56) References Cited

FOREIGN PATENT DOCUMENTS

| | | |
|---|---|---|
| JP | H06318579 A | 11/1994 |
| KR | 20160075113 A | 6/2016 |
| KR | 101934561 B1 | 3/2019 |
| KR | 101957440 B1 | 3/2019 |
| KR | 20190080501 A | 7/2019 |
| WO | WO 2020012371 A1 * | 1/2020 ............... B01D 1/28 |

OTHER PUBLICATIONS

International Search Report for PCT/KR2022/005650 mailed Jul. 13, 2022.

* cited by examiner

*Primary Examiner* — Nicole M Ippolito
(74) *Attorney, Agent, or Firm* — Renaissance IP Law Group LLP

(57) ABSTRACT

Provided is an exhaust gas treatment apparatus that treats exhaust gas generated from semiconductor process and directed to a vacuum pump. Exhaust gas treatment apparatus includes a plasma generating unit for generating plasma, a reaction chamber in which perfluoride is decomposed by the plasma to generate a decomposition gas, and gas supplying unit for supplying the decomposition gas from the reaction chamber to a processing chamber in which the exhaust gas from the semiconductor process is introduced and treated exhaust gas is discharged to the vacuum pump. Decomposition gas reacts with the exhaust gas in the processing chamber to suppress generation of salt in solid state by a component of the exhaust gas.

8 Claims, 13 Drawing Sheets

<SALT GENERATION REACTION OF SEMICONDUCTOR PROCESS>

* $6TiCl_4 + 8NH_3 \rightarrow 6TiN + N_2 + 24HCl + NH_4Cl$

SALT GENERATION HAVING VISCOSITY

Solid $NH_4Cl$

FIG. 11

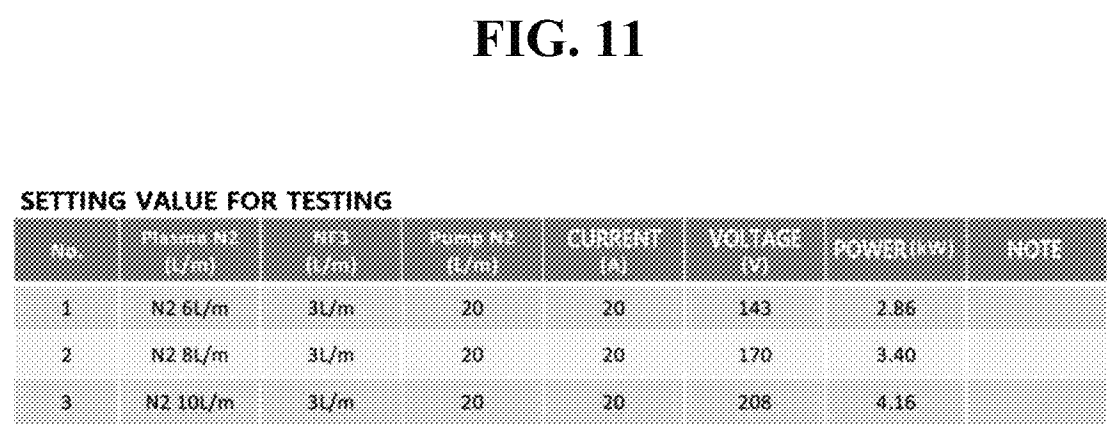

| SETTING VALUE FOR TESTING | | | | | |
|---|---|---|---|---|---|
| No. | GAS FLOW (sccm) | GAS FLOW (L/m) | POWER (W) | CURRENT (A) | VOLTAGE (V) | POWER RATIO | NOTE |
| 1 | N2 6L/m | 3L/m | 20 | 20 | 143 | 2.86 | |
| 2 | N2 8L/m | 3L/m | 20 | 20 | 170 | 3.40 | |
| 3 | N2 10L/m | 3L/m | 20 | 20 | 208 | 4.16 | |

FIG. 13

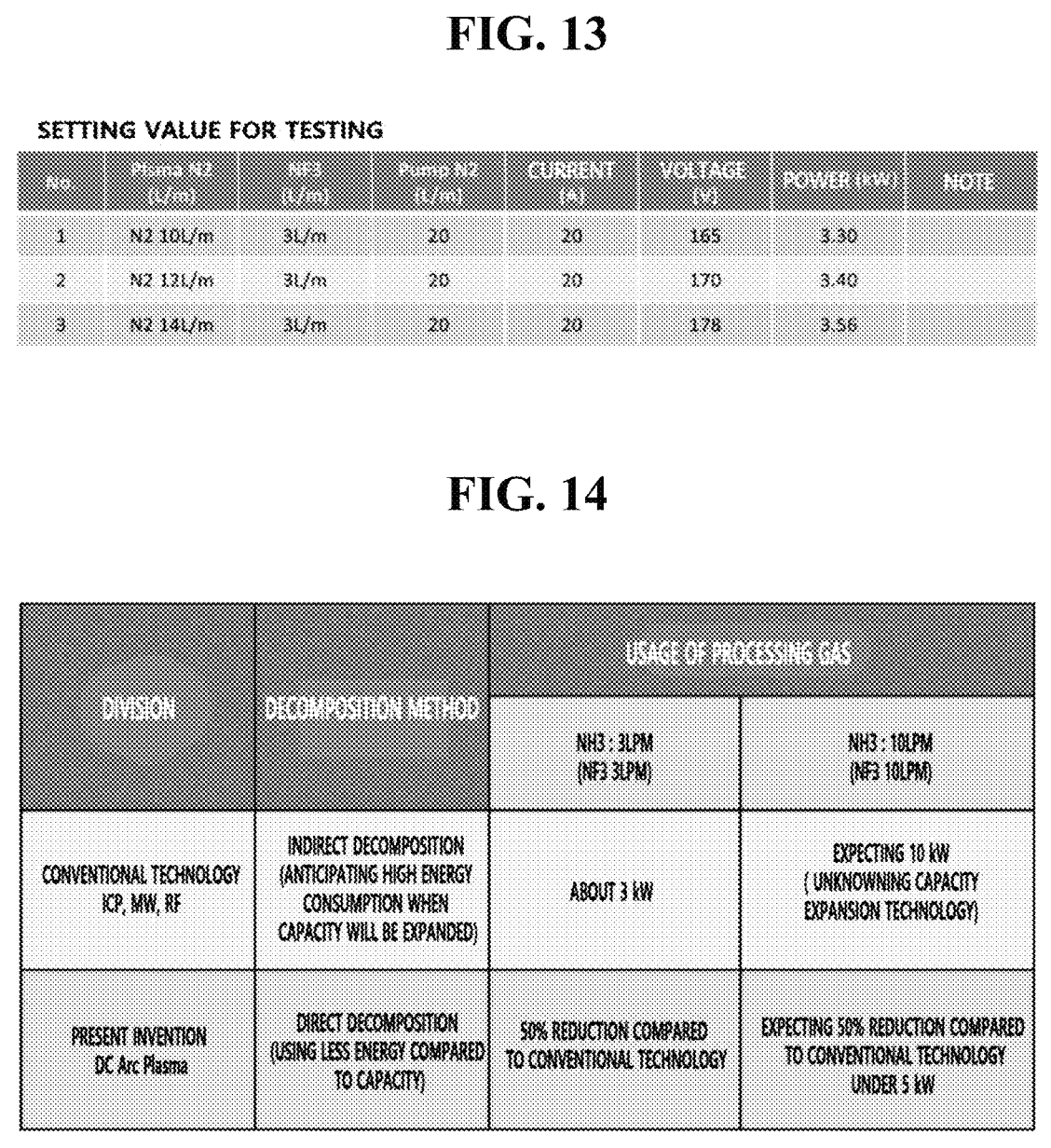

SETTING VALUE FOR TESTING

| CH | N2 FLOW (L/m) | H2 FLOW (L/m) | COIL ID (A) | CURRENT (A) | VOLTAGE (V) | POWER (kW) | NOTE |
|----|----|----|----|----|----|----|----|
| 1 | N2 10L/m | 3L/m | 20 | 20 | 165 | 3.30 | |
| 2 | N2 12L/m | 3L/m | 20 | 20 | 170 | 3.40 | |
| 3 | N2 14L/m | 3L/m | 20 | 20 | 178 | 3.56 | |

FIG. 14

| DIVISION | DECOMPOSITION METHOD | USAGE OF PROCESSING GAS | |
|----|----|----|----|
| | | NH3 : 3LPM (NF3 3LPM) | NH3 : 10LPM (NF3 10LPM) |
| CONVENTIONAL TECHNOLOGY ICP, MW, RF | INDIRECT DECOMPOSITION (ANTICIPATING HIGH ENERGY CONSUMPTION WHEN CAPACITY WILL BE EXPANDED) | ABOUT 3 kW | EXPECTING 10 kW ( UNKNOWNING CAPACITY EXPANSION TECHNOLOGY) |
| PRESENT INVENTION DC Arc Plasma | DIRECT DECOMPOSITION (USING LESS ENERGY COMPARED TO CAPACITY) | 50% REDUCTION COMPARED TO CONVENTIONAL TECHNOLOGY | EXPECTING 50% REDUCTION COMPARED TO CONVENTIONAL TECHNOLOGY UNDER 5 kW |

DEVICE FOR TREATING SEMICONDUCTOR PROCESS EXHAUST GAS

TECHNICAL FIELD

The present disclosure relates to treatment apparatus of exhaust gas generated at semiconductor process, and more specifically, to exhaust gas treatment apparatus for suppressing generation of solid salt before exhaust gas is expelled to a vacuum pump.

BACKGROUND ART

As the semiconductor and LCD industries become larger and production increases, the gas used in the process is also increasing. The semiconductor manufacturing process has a number of steps, and the types of gases used therein are as diverse as the number of steps of the process.

For example, in a semiconductor device manufacturing process, processes such as photolithography, etching, diffusion, and metal deposition are repeatedly performed on a wafer supplied to a process chamber. During the semiconductor manufacturing process, various process gases are used, and after the process is completed, the exhaust gas is discharged from the process chamber by a vacuum pump, and since the exhaust gas may contain toxic components, it is purified by treatment apparatus such as a scrubber.

However, power is generated from the exhaust gas of semiconductor process depending on the temperature and pressure conditions. For example, in case of a TiN forming process in which titanium nitride (TiN) is deposited on a wafer by reacting titanium chloride ($TiCl_4$) gas with ammonia ($NH_3$) gas using chemical vapor deposition (CVD), the ammonium chloride ($NH_4Cl$) powder as well as residual TiN powder discharged without being deposited on the wafer is deposited in the exhaust pipe or vacuum pump, and the deposited powder causes various problems.

FIG. 1 is view for explaining an example in which salt powder is generated due to exhaust gas in a semiconductor process.

Referring to FIG. 1, $NH_4Cl$ powder is generated by reacting HCl gas and $NH_3$ gas which is contained in the exhaust gas discharged from TiN processing chamber during TiN process. The $NH_4Cl$ on condition of 160° C. to 170° C. is gas phase at foreline, where the pressure is 1 Torr to 2 Torr. However, the phase of the $NH_4Cl$ is changed to solid phase at 760 Torr and 340° C.

In order to solve the problem of powder deposition in the exhaust pipe by $NH_4Cl$, a heater such as a heating jacket is conventionally used. The heater prevents HCl gas from reacting with the $NH_3$ gas to produce $NH_4Cl$ in a solid state by heating the exhaust pipe to a specific temperature or higher. In addition, $NH_4Cl$ in a solid state is decomposed to HCl gas and $NH_3$ gas due to the heater, and the decomposed gases pass through the exhaust pipe.

However, this conventional art is difficult to be a fundamental solution to the problem of powder deposition because HCl gas and $NH_3$ gas can easily react, so that $NH_4Cl$ powder can be easily regenerated.

So, $NH_4Cl$ which is one of by-products in process using $TiCl$, $NH_3$ or $WF_6$, in particular and is formed in a large amount in TiN process of ALD becomes a solid salt, and causes the above-mentioned problem. Due to the deposited solid salt, the number of the vacuum pump malfunction increases and the stop loss increases, so that production and facility operation are difficult. In addition, the cleaning cost due to frequent maintenance increases. Therefore, there is a need for a solution for the stable and economical operation of the vacuum pump.

DISCLOSURE

Technical Problem

A technical object of the present inventive concept is to provide exhaust gas treatment apparatus which is used in semiconductor process, locates in front of the vacuum pump, suppresses the generation of $NH_4Cl$ salt powder through decomposition (generation of F radical) of $NF_3$ gas, and secures lifetime of plasma electrode compared to the conventional technology.

The technical problems to be achieved by the present inventive concept are not limited to the technical problems mentioned above, and other technical problems not mentioned can be clearly understood by those of ordinary skill in the art to which the present inventive concept belongs by the following description.

Technical Solution

In order to solve the above problem, one embodiment of the present inventive concept provides exhaust gas treatment apparatus for semiconductor process, which performs processing the exhaust gas generated from the semiconductor process and directed to the vacuum pump. The exhaust gas treatment apparatus includes a plasma generating unit for generating plasma; reaction chamber in which perfluoride is decomposed by the plasma to generate a decomposition gas; and a gas supplying unit for supplying the decomposition gas from the reaction chamber to a processing chamber in which the exhaust gas from the semiconductor process is introduced and treated exhaust gas is discharged to the vacuum pump, wherein the decomposition gas reacts with the exhaust gas in the processing chamber to suppress generation of salt in solid state by a component of the exhaust gas.

In an embodiment of the present inventive concept, the plasma generating unit generates $N_2$ plasma by arc plasma, $NF_3$ that is the perfluoride supplied to the reaction chamber is decomposed by the $N_2$ plasma to be formed as the decomposition gas having $N_2$, $NF_3$ or F. The decomposition gas supplied to the processing chamber reacts with $NH_3$ of the exhaust gas or generated $NH_4Cl$ to generate gaseous $NH_4F$, thereby generation of solid $NH_4Cl$ is suppressed.

In an embodiment of the present inventive concept, the gas supplying unit may include a connection pipe; and a gas injecting unit. The decomposition gas flows the connection pipe from the reaction chamber, and the gas injecting unit is provided between the connection pipe and the processing chamber, and injects the decomposition gas into the processing chamber.

In an embodiment of the present inventive concept, the gas injecting unit may include exterior portion of which one end is coupled to the connection pipe and a differential pressure centering ring. The differential pressure centering ring is provided inside the exterior portion to pass through the other end of the exterior portion and is spaced apart from the inner surface of the exterior portion, and injects the decomposition gas into the processing chamber by a pressure difference between the connection pipe and processing chamber.

In an embodiment of the present inventive concept, the uniformity of the decomposition gas may be improved by vortex due to the space between the differential pressure centering ring and inner surface of the exterior portion, and then the decomposition gas may be introduced into the differential pressure centering ring.

In an embodiment of the present inventive concept, the $NF_3$ gas is supplied to the reaction chamber instead of between anode and cathode generating the arc plasma, so that the lifetime of the anode and cathode can be improved.

In an embodiment of the present inventive concept, ammonium chloride is formed by the following reaction formula 1 due to the exhaust gas, $$6TiCl_{4+20}NH_3 \rightarrow 6TiN + N_2 + 12HCl + 12NH_4Cl \quad \text{[reaction formula 1]}$$

In the processing chamber, generation of solid ammonium chloride salt may be suppressed by reaction formula 2 and reaction formula 3 below.

$$TiCl_4 + 4NH_3 + 3F \rightarrow TiN + 3NH_4F + 2Cl_2 \quad \text{[reaction formula 2]}$$

$$8NH_4Cl + 6F \rightarrow 6NH_4F + 8HCl + N_2 \quad \text{[reaction formula 3]}$$

In an embodiment of the present inventive concept, the controller for adjusting the supply amount and components of the decomposition gas by controlling the $N_2$ plasma supply amount and the $NF_3$ supply amount may be further included.

Advantageous Effects

According to the present inventive concept, the generation of ammonium chloride salt is suppressed by the decomposition gas, and productivity is improved due to a decrease in the number of vacuum pump malfunction and a decrease in stop loss. In addition, it is possible to extend the PM (Preventive Maintenance) cycle.

In addition, the exterior portion and the differential pressure centering structure in the gas supplying unit make the components of the decomposition gas more uniform.

In addition, it is possible to overcome the limitations of the capacity of the conventional microwave, ICP or RF method by the exhaust gas treatment apparatus of the present inventive concept. The conventional arts have disadvantages such as increases of capacity, energy and operating cost due to an increase of gas consumption in recent nano processes. However, according to the exhaust gas treatment apparatus of the present inventive concept, the amount of the processing gas used is controlled by easily adjusting the supply amount of the decomposition gas.

In addition, a method of supplying $NF_3$ gas to the reaction chamber and decomposing $NF_3$ by $N_2$ plasma to generate decomposition gas is used instead of directly injecting $NF_3$ gas to the electrode of the plasma generating unit. Therefore, it is possible to solve the problem of an electrode lifetime generated when $NF_3$ is directly sprayed to the electrode, and to extend the lifetime of the electrode of the plasma generating unit. Of course, a material with strong corrosion resistance may be employed for the reaction chamber.

It should be understood that the effects of the present inventive concept are not limited to the above-described effects, and include all effects that can be inferred from the configuration of the invention described in the detailed description or claims of the present inventive concept.

DESCRIPTION OF DRAWINGS

FIGS. 10 and 11 are views showing test results of $NF_3$ decomposition efficiency of exhaust gas treatment apparatus according to an embodiment of the present inventive concept.

FIGS. 12 and 13 are diagrams showing performance test results of an exhaust gas treatment apparatus according to an embodiment of the present inventive concept.

FIG. 14 is diagram for explaining performance and effects of exhaust gas treatment apparatus according to an embodiment of the present inventive concept.

MODES OF THE INVENTION

Figure 1:
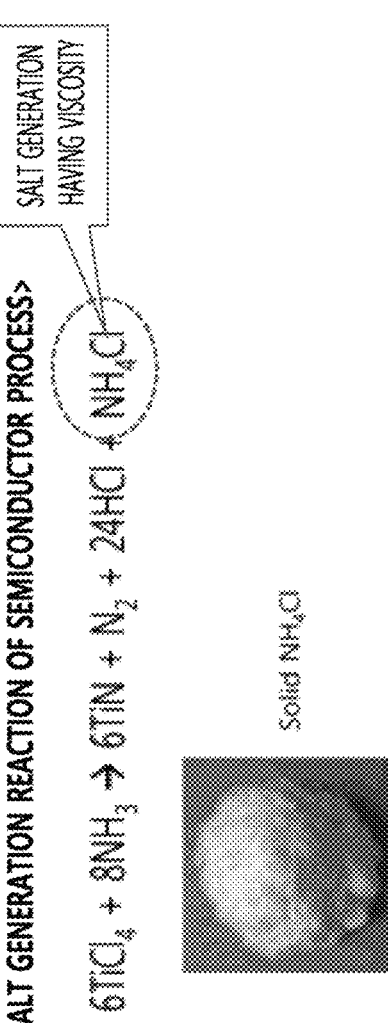
FIG. 1 is view for explaining an example in which salt powder is generated due to exhaust gas in a semiconductor process.

Since the present inventive concept may be variously changed and have various forms, specific embodiments will be exemplified in the drawings and described in detail in the text. However, it should be understood that this does not limit the present inventive concept to a specific disclosure, and includes all modifications, equivalents and substitutes included in the spirit and the scope of the present inventive concept. In a description of each drawing, similar reference numerals are used for similar elements.

Unless otherwise defined, all terms used herein, including technical or scientific terms, have the same meaning as generally understood by those skilled in the art. Terms such as terms defined in generally used dictionaries should be interpreted as having meanings consistent with the meanings in the context of the related art, and should not be interpreted in an idealistic or excessively formal sense unless otherwise defined in the present application.

Hereinafter, exemplary embodiments of the present inventive concept will be described in more detail with reference to the accompanying drawings.

Embodiment

The present inventive concept is related to exhaust gas treatment apparatus that treats exhaust gas generated from a semiconductor process and directed to a vacuum pump. The exhaust gas treatment apparatus of the present inventive concept prevents by-products caused by specific gases generated in the semiconductor main process from flowing into the vacuum pump and causing problems in pump maintenance and facility operation. Accordingly, it is possible to improve the efficiency of pump maintenance and facility operation and to improve the lifetime of the vacuum pump.

Figure 2:
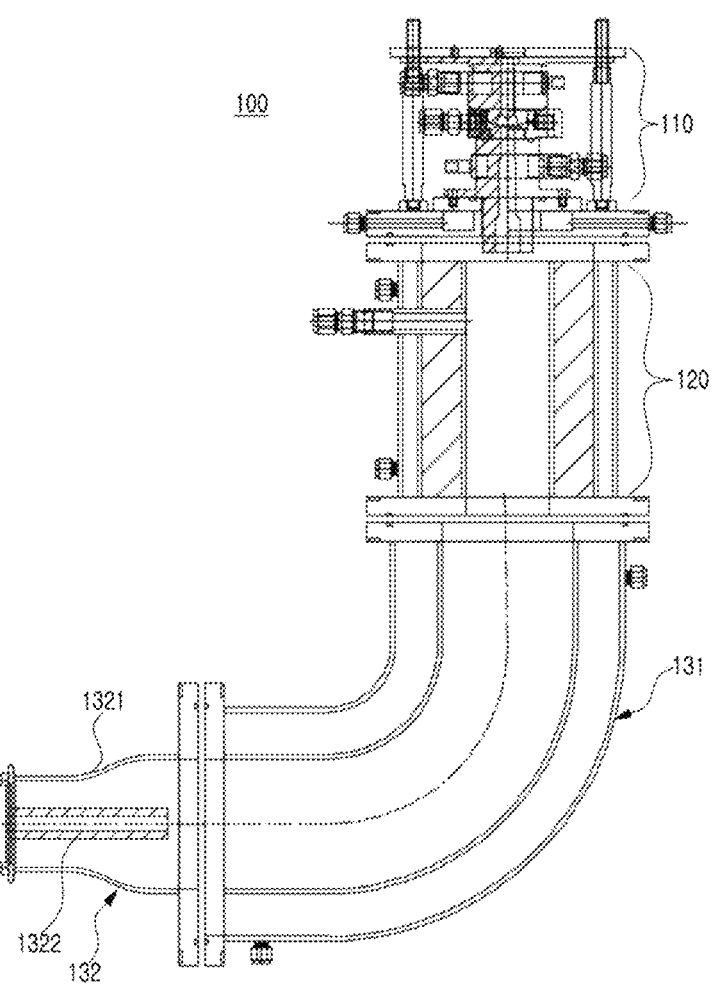
FIG. 2 is a view showing an exhaust gas treatment apparatus for semiconductor process according to an embodiment of the present inventive concept.

FIG. 2 is a view showing an exhaust gas treatment apparatus for semiconductor process according to an embodiment of the present inventive concept.

Referring to FIG. 2, exhaust gas treatment apparatus 100 for semiconductor process has plasma generating unit 110, reaction chamber 120 and gas supplying unit 130.

The plasma generating unit 110 has an anode and a cathode, and may generate arc plasma. In addition, nitrogen ($N_2$) gas may be supplied to the plasma generating unit 110, and nitrogen ($N_2$) plasma may be generated by arc plasma.

In the reaction chamber 120, perfluoride is decomposed by the plasma to generate decomposition gas. That is, perfluoride and plasma are introduced into the reaction chamber 120, and the perfluoride is changed to a decomposition gas by the plasma.

The gas supplying unit 130 may supply decomposition gas from the reaction chamber 120 to the processing chamber 200. The decomposition gas in the gas supplying unit 130 has a uniform concentration. To acquire uniform concentration, the gas supplying unit 130 has a connection pipe 131 and a gas injecting unit 132.

The connection pipe 131 is a double-structured elbow part, cooling is performed through water in the outer space of the connection pipe 131, and decomposition gas is supplied from the reaction chamber 120 to inner space of the connection pipe 131. The connection pipe 131 is disposed between the reaction chamber 120 and the gas injecting unit 132, cools the decomposition gas supplied from the reaction chamber 120, and supplies it to the gas injecting unit 132.

The gas injecting unit 132 has an exterior portion 1321 and a differential pressure centering ring 1322. One side of the exterior portion 1321 is connected to the connection pipe 131, and the pressure differential centering ring 1322 is fastened to the other side. The differential pressure centering ring 1322 is disposed inside the exterior portion 1321 and has a shape protruding toward the connection pipe 131. The decomposition gas in the gas injecting unit 132 has a uniform concentration by eddy current and is discharged to the outside.

Figure 3:
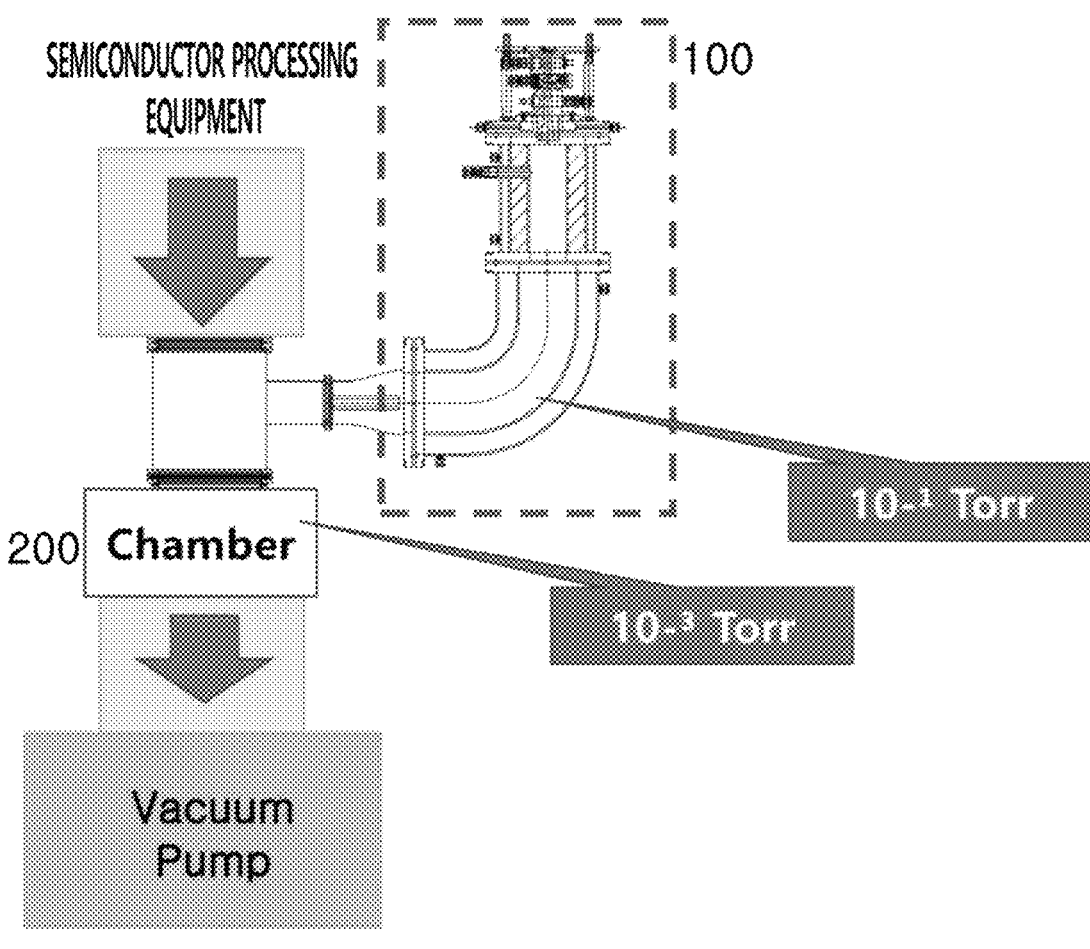
FIG. 3 is a view for explaining a process in which the exhaust gas treatment apparatus operates between semiconductor processing equipment and vacuum pump according to an embodiment of the present inventive concept.

FIG. 3 is a view for explaining a process in which the exhaust gas treatment apparatus operates between semiconductor processing equipment and vacuum pump according to an embodiment of the present inventive concept.

Referring to FIG. 3, exhaust gas from the semiconductor process flows into the processing chamber 200, and decomposition gas supplied from the exhaust gas treatment apparatus 100 also flows into the processing chamber 200. In the processing chamber 200, a treated exhaust gas is generated by a reaction between the exhaust gas and the decomposition gas, and the treated exhaust gas is discharged to a vacuum pump.

The decomposition gas supplied from the gas supplying unit 130 to the processing chamber 200 may react with the exhaust gas in the processing chamber 200 to suppress generation of salt of solid state or remove already generated salt of solid state.

Figure 4:
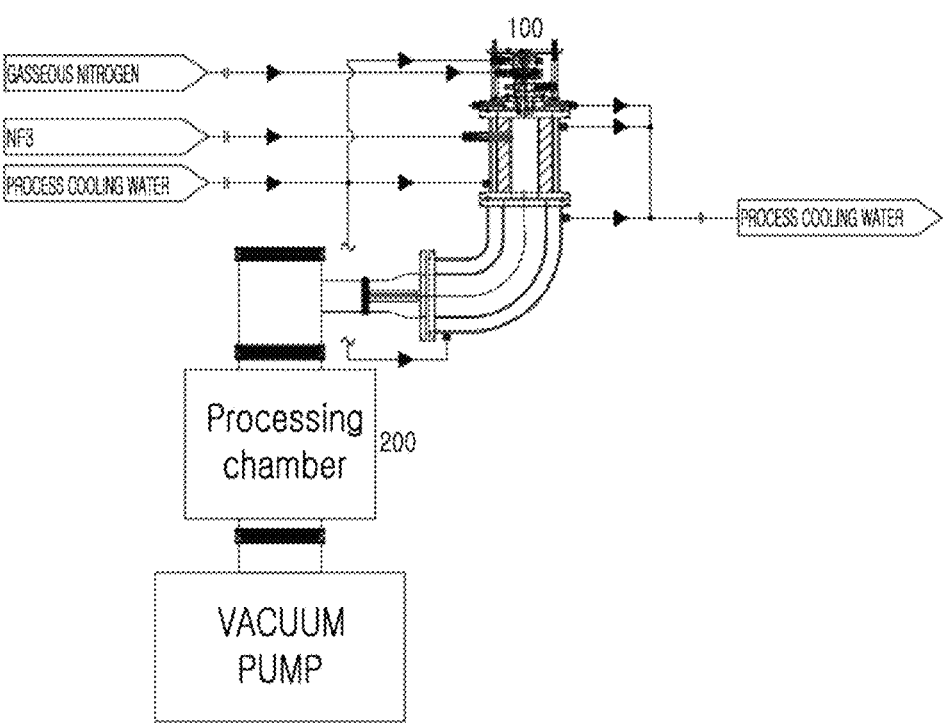
FIG. 4 is a view for explaining a method in which the exhaust gas treatment apparatus is connected to the exhaust gas supplied from a semiconductor process and connected to a vacuum pump.

FIG. 4 is a view for explaining a method in which the exhaust gas treatment apparatus is connected to the exhaust gas supplied from a semiconductor process and connected to a vacuum pump.

Referring to FIG. 4, nitrogen gas is supplied to the plasma generating unit, and cooling water is supplied to the plasma generating unit. In addition, as an example of perfluoride, $NF_3$ gas is supplied to the reaction chamber, and cooling water is supplied to the reaction chamber. Cooling water is also supplied to the gas supplying unit, and the supplied cooling water is filled in the outer space of the connection pipe, which is a double-structured elbow part, and is used to cool the decomposition gas.

Figure 5:
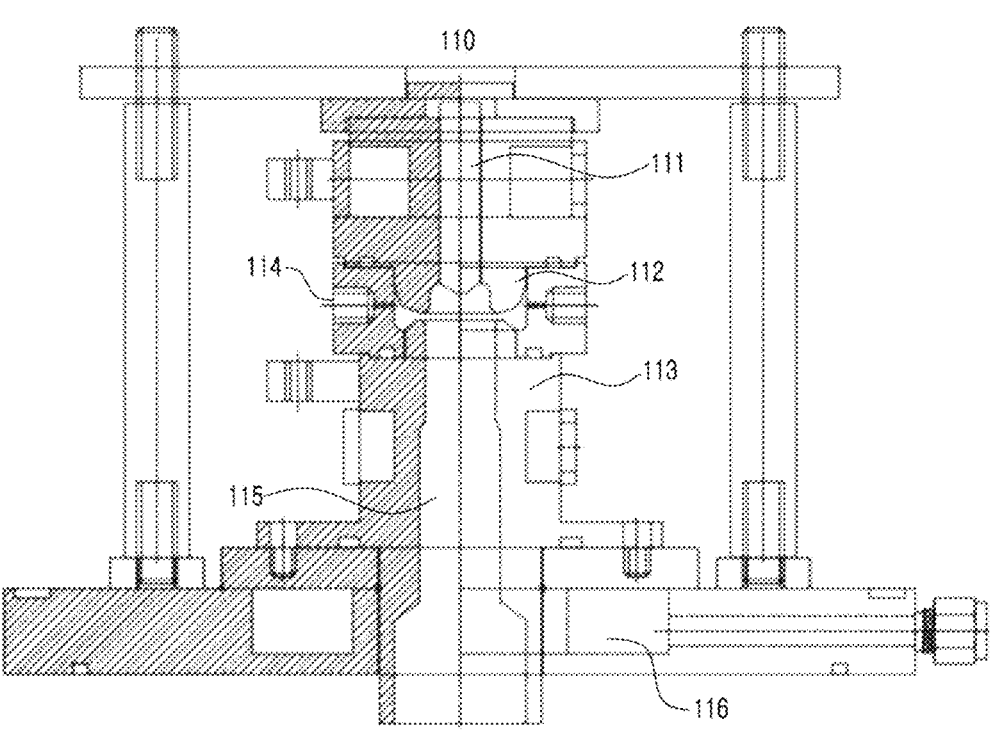
FIG. 5 a diagram illustrating an example of a plasma generating unit and a reaction chamber of exhaust gas treatment apparatus.

FIG. 5 is a cross-sectional view showing the plasma generating unit of FIG. 2 of the present inventive concept.

Referring to FIG. 5, the plasma generating unit 110 may generate $N_2$ plasma by arc plasma. The plasma generating unit 110 may include an electrode cooling PCW unit 111, a cathode 112, an anode 113, an $N_2$ supply unit 114, a plasma circular tube 115, and a cooling PCW unit 116. The PCW is an abbreviation of process cooling water and refers to a cooling operation through water. However, the cooling operation does not necessarily have to be water, and any liquid capable of performing the cooling operation may be used.

When $N_2$ gas is introduced through the $N_2$ supply unit 114, $N_2$ plasma is generated between the cathode 112 and the anode 113 through arc discharge of the cathode 112 and the anode 113. The generated $N_2$ plasma is discharged through the plasma circular tube 115. The electrode cooling PCW unit 111 prevents the cathode 112 or the anode 113 from overheating and performs a cooling operation. In addition, the cooling PCW unit 116 prevents high-temperature heat of the plasma generating unit 110 from being transferred to the reaction chamber 120 to hinder decomposition operation of gas.

Figure 6:
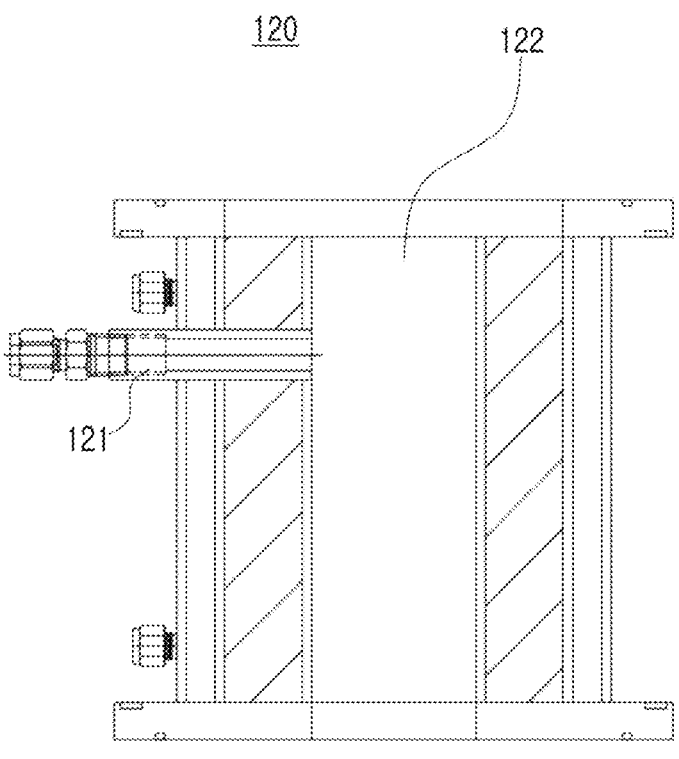
FIG. 6 is a view for explaining that $NF_3$ is supplied to reaction chamber.

FIG. 6 is a cross-sectional view showing the reaction chamber of FIG. 2 of the present inventive concept.

Referring to FIG. 6, the reaction chamber has a perfluoride inlet 121 and an inner chamber 122. Gaseous perfluoride is supplied through the perfluoride inlet 121 and introduced into the inner chamber 122. $NF_3$ gas which is an example of perfluoride supplied to the inner chamber 122 of the reaction chamber 120 is decomposed by $N_2$ plasma to generate decomposition gas containing $N_2$, $NF_3$, or $F^-$. That is, F radicals may be generated by plasma decomposition of $NF_3$ gas.

The $NF_3$ gas is not directly supplied to the torch of the plasma generating unit, but flows into the reaction chamber 120 connected to the plasma generating unit. That is, since the $NF_3$ gas is supplied to the reaction chamber 120 instead of between the anode and cathode generating the arc plasma, the lifetime of the anode and cathode of the plasma generating unit can be improved.

Since the reaction chamber 120 has a double-structured chamber structure, a plasma flame is maintained at a state close to atmospheric pressure and plasma density can be secured.

The generated decomposition gas is supplied to the processing chamber as described above, and the decomposition gas reacts with $NH_3$ of the exhaust gas or generated $NH_4Cl$ to generate gaseous $NH_4F$, so that the generation of solid $NH_4Cl$ can be suppressed.

Figure 7:
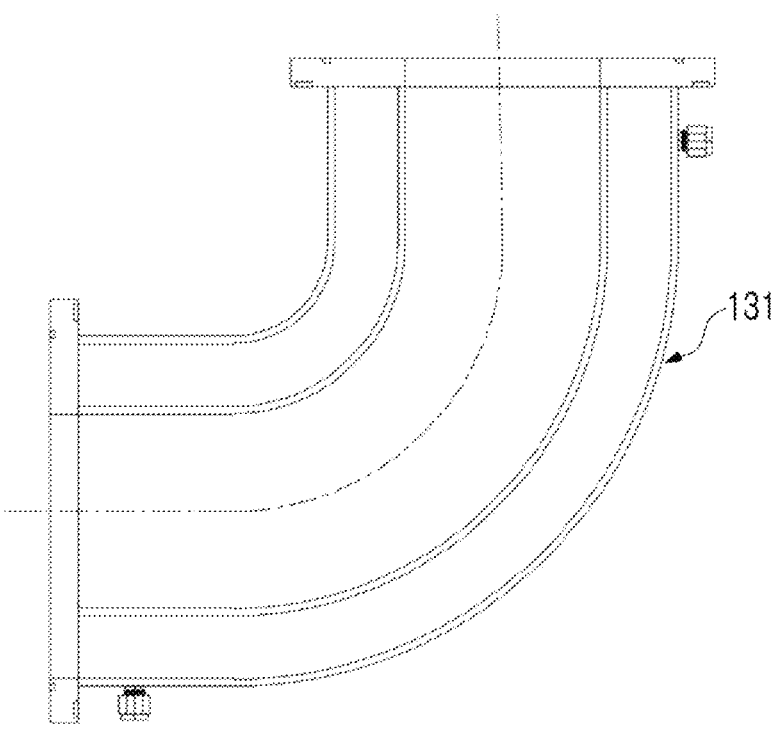
FIG. 7 is a view for explaining a connection part of exhaust gas treatment apparatus.

FIG. 7 is a view for explaining a connection pipe of a gas supplying unit of exhaust gas treatment apparatus.

Figure 8:
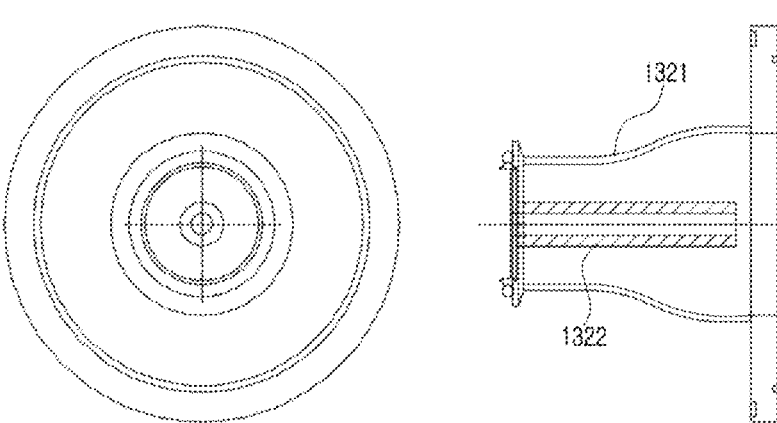
FIG. 8 is a diagram for explaining pressure differential centering ring in a connection part of an exhaust gas treatment apparatus.

FIG. 8 is a diagram for explaining a gas injecting unit of a gas supplying unit of an exhaust gas treatment apparatus.

Figure 9:
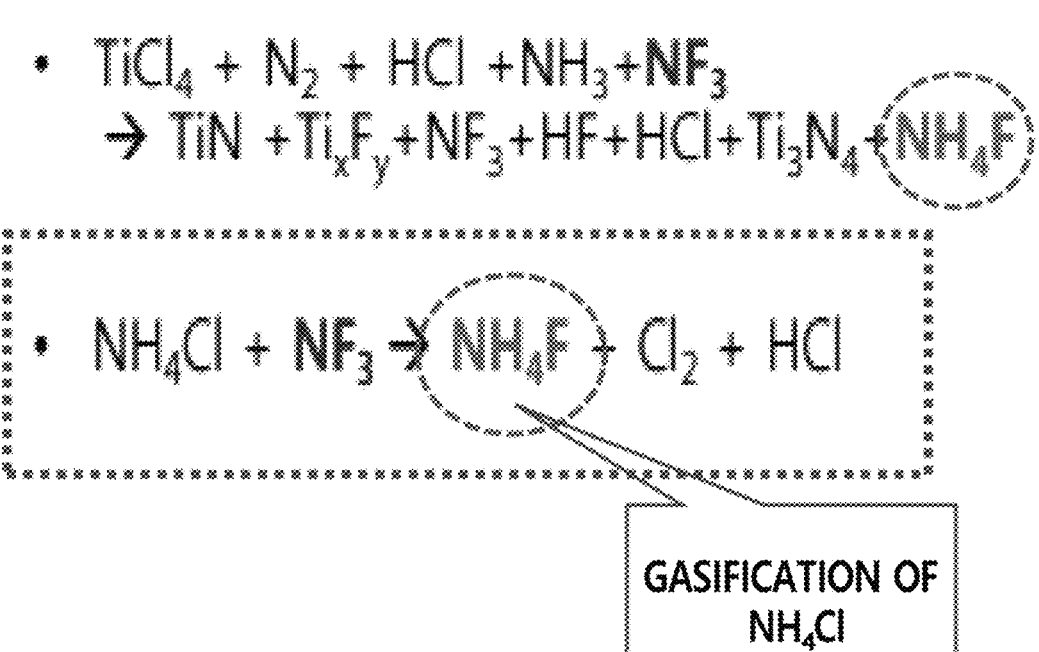
FIG. 9 is a view for explaining a process of reducing salt powder by exhaust gas treatment apparatus according to an embodiment of the present inventive concept.

FIG. 9 is a diagram for explaining a process of suppressing generation of salt powder by exhaust gas treatment apparatus according to an embodiment of the present inventive concept.

The gas supplying unit 130 may include a connection pipe 131 and a gas injecting unit 132.

Referring to FIG. 7, one end of the connection pipe 131 is connected to the reaction chamber 120 and the other end is connected to the gas supplying unit. Decomposition gas from the reaction chamber 120 may be moved through the connection pipe 131. For example, the connection pipe 131 may be a double-structured elbow part. The double-structured elbow part may have a PCW (process cooling water) supply structure, and accordingly, the temperature of the decomposition gas in the connection pipe may be controlled through cooling effect in the inner pipe. That is, in the double structure, the outer space is filled with cooling water, and the decomposition gas is supplied to the inner space. The temperature-controlled decomposition gas is introduced into the gas injecting unit.

Referring to FIG. 8, a gas injecting unit 132 may be provided between the connection pipe 131 and the processing chamber. The gas injecting unit 132 may inject the decomposition gas from the connection pipe 131 into the processing chamber.

For example, the gas injecting unit 132 may include an exterior portion 1321 having one end coupled to the connection pipe 131 and a differential pressure centering ring 1322. The gas injecting unit 132 may be a connection centering ring structure that distributes pressure inside the connection pipe 131.

The exterior portion 1321 may be a tubular connector connecting the connection pipe 131 and the processing chamber. The exterior portion 1321 may have a shape in which a diameter decreases as it approaches the differential pressure centering ring 1322. One side of the exterior portion 1321 is connected to the connection pipe, and the other side of the exterior portion 1321 is connected to the differential pressure centering ring 1322.

The differential pressure centering ring 1322 may be provided inside the exterior portion 1321 to be spaced apart from the inner surface of the exterior portion 1321. The differential pressure centering ring 1322 has a tubular structure with a smaller diameter than the exterior portion 1321 and has a shape protruding toward the connection pipe 131. The differential pressure centering ring 1322 may inject the decomposition gas into the processing chamber by a pressure difference between the processing chamber and the connection pipe 131. For example, the pressure of the connection pipe 131 may be $10^{-1}$ Torr and the pressure of the processing chamber may be $10^{-3}$ Torr. Due to the structural characteristics of the differential pressure centering ring, fluid vortex and fluid pressure increase at neighboring region of the differential pressure centering ring. Accordingly, the fluidic pressure in the inner region of the exterior portion where the differential pressure centering ring is positioned has a higher value than the pressure in the area discharged from the differential pressure centering ring. Therefore, the decomposition gas of the differential pressure centering ring may flow into the processing chamber due to the difference of pressure.

A vortex may be generated due to a space between the outer surface of the pressure differential centering ring 1322 and the inner surface of the exterior portion 1321. A vortex is a phenomenon in which a part of a fluid is disturbed and flows in the opposite direction to the main current. The decomposition gas introduced from the connection pipe 131 has a main stream from the connection pipe toward the differential pressure centering ring 1322. The decomposition gas forms a vortex flowing in the opposite direction to the main stream in space between the outer surface of the differential pressure centering ring 1322 and inner surface of the exterior portion 1321. Since the radius of the exterior portion 1321 decreases as the distance from the connection pipe 131 increases, the pressure increases as it approaches the processing chamber of FIG. 3. Therefore, the speed of the vortex has a higher value than the speed of the main current, and the decomposition gas in the gas injecting unit has a uniform concentration. Accordingly, the uniformity of the decomposition gas flowing from the connection pipe 131 to the gas injecting unit 132 is improved so that it can flow into the inlet of the differential pressure centering ring. Thus, decomposition gas with improved uniformity can be supplied to the processing chamber.

Due to the semiconductor process, an ammonium salt may be formed as shown in reaction formula 1 below.

$$6TiCl_4+20NH_3 \rightarrow 6TiN+N_2+12HCl+12NH_4Cl \qquad \text{[reaction formula 1]}$$

As described above, such ammonium chloride may undergo a phase change from a gas phase to a solid phase depending on temperature and pressure conditions. When the solid salt is formed and flows into the vacuum pump, it may cause a failure of the vacuum pump and cause a great difficulty in ordinary operation such as stopping the process.

The exhaust gas treatment apparatus for semiconductor process according to the present embodiment gasifies solid salts generated from exhaust gas of the semiconductor process before being discharged to the vacuum pump, thereby preventing problems such as failure of the vacuum pump.

Specifically, as shown in reaction formula 2 and reaction formula 3 below in the processing chamber, the generation of solid ammonium chloride salt can be suppressed.

$$TiCl_4+4NH_3+3F \rightarrow TiN+3NH_4F+2Cl_2 \qquad \text{[reaction formula 2]}$$

$$8NH_4Cl+6F \rightarrow 6NH_4F+8HCl+N_2$$

The decomposition gas formed by the $N_2$ plasma may include $N_2$, $NF_3$ or $F^-$. The high energy components of the decomposition gas react with ammonia in the exhaust gas to suppress the production of ammonium chloride, or react with already produced ammonium chloride to decompose ammonium chloride, so that the production of solid ammonium chloride salt can be suppressed.

Figure 10:
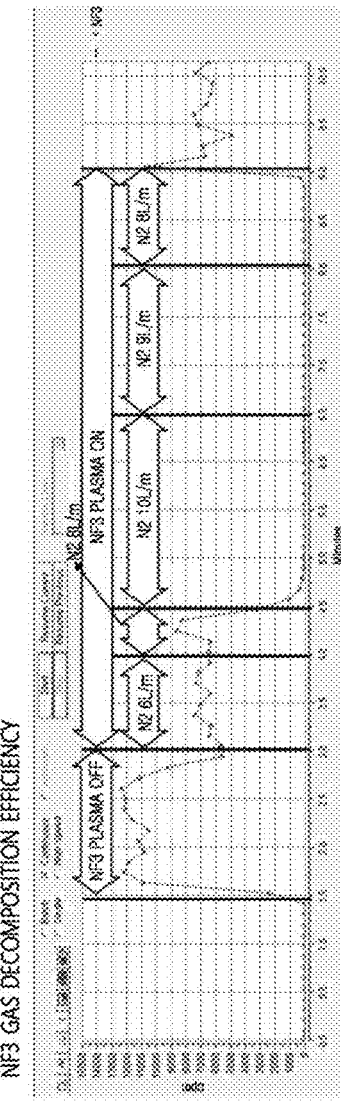

FIG. 10 is a diagram showing test results of the decomposition efficiency of $NF_3$ gas of exhaust gas treatment apparatus according to an embodiment of the present inventive concept.

FIG. 11 is a table disclosing test conditions of FIG. 10 according to an embodiment of the present inventive concept.

FIG. 11 shows process conditions such as $N_2$ plasma supply amount.

Referring to FIGS. 10 and 11, $N_2$ plasma is generated according to current and voltage conditions set in the table. The amount of $N_2$ plasma generated by flowing into the plasma generating unit is shown in the table of FIG. 11. In addition, $NF_3$, which is a perfluoride, is supplied to the reaction chamber at a flow rate of 3 L/m. Under the condition that exhaust gas is not supplied, the amount of $NF_3$ gas is measured at the rear end of the vacuum pump. It can be seen that a large amount of $NF_3$ gas is detected when the plasma is off, and when $N_2$ plasma is supplied at 6 L/m, $NF_3$ is reduced and decomposition is proceeded. Thereafter, when the $N_2$ plasma increases, it can be confirmed that the decomposition is effectively performed because the amount of $NF_3$ detected is very small or almost not detected.

As described above, the amount and composition of the decomposition gas may be controlled by adjusting the amount of $N_2$ plasma, and adjusted decomposition gas may be supplied to the processing chamber. That is, the $N_2$, $NF_3$, or $F^-$ component included in the decomposition gas can be controlled.

The exhaust gas treatment apparatus of the present embodiment may further include a control unit configured to control the components and supply amount of the decomposition gas by adjusting the $N_2$ plasma supply amount and the $NF_3$ supply amount.

Figure 12:
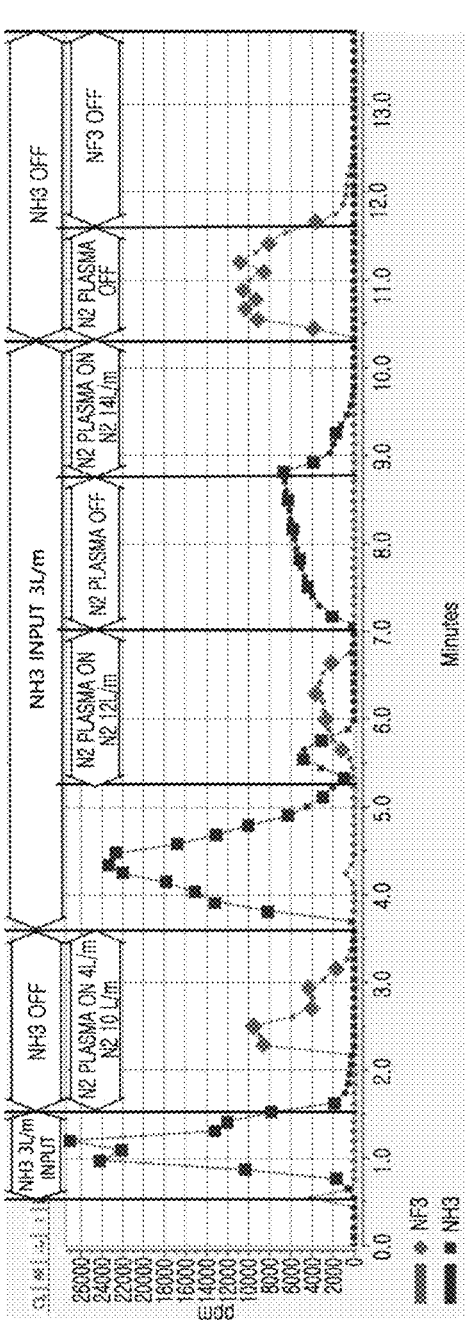

FIG. 12 is a view showing testing result for reaction of ammonia in a processing chamber according to an embodiment of the present inventive concept.

FIG. 13 is a table disclosing the test conditions of FIG. 12 according to an embodiment of the present inventive concept.

Referring to FIGS. 12 and 13, $NH_3$ gas is supplied to the process chamber, and $N_2$ gas as shown in FIG. 12 is supplied to the plasma generating unit. In addition, $NF_3$ gas is supplied to the reaction chamber at a flow rate of 3 L (liter)/min The flow rate of $N_2$ discharged through the vacuum pump is 20 L/min. The current voltage condition represents power for generating $N_2$ plasma in the plasma generating unit. In the graph of FIG. 12, the concentrations of $NF_3$ and $NH_3$ are indicated, and the concentrations are those measured in gas discharged through a vacuum pump.

From 30 seconds after the performance test starts, ammonia flows into the process chamber. When one and half minutes have elapsed, supply of $NH_3$ is stopped, and $NF_3$ gas is supplied to the $N_2$ plasma. In addition, $NH_3$ gas is supplied from about 3 and half minutes, and $N_2$ plasma is repeatedly turned on/off by dividing the time interval. Through repeated on/off of the $N_2$ plasma, the processing gases are evenly distributed in the reaction chamber, the gas supplying unit, and the processing chamber, and conditions for normal operation of various components are provided.

When the $N_2$ plasma is turned on after about 8 minutes and 45 seconds have elapsed, the $NH_3$ gas supplied to the processing chamber starts to be decomposed and the concentration rapidly decreases. In addition, when 10 minutes and 20 seconds have elapsed, the $N_2$ plasma is turned off and the supply of the $NH_3$ gas is also stopped. By turning off the $N_2$ plasma, decomposition gas due to the decomposition of $NF_3$ is not generated, and the supplied $NF_3$ is discharged through the vacuum pump, and the amount of discharged $NF_3$ increases. In addition, since the supply of $NH_3$ gas is also stopped, $NH_3$ discharged through the vacuum pump is not detected.

Finally, when the $N_2$ plasma is turned on after 11 minutes and 35 seconds have elapsed, the $NF_3$ gas is decomposed by the plasma and generated as a decomposition gas. Thus, the amount of $NF_3$ in the vacuum pump is drastically reduced.

That is, it can be confirmed that the components of the decomposition gas generated when the plasma is on reacts very well with ammonia in the exhaust gas, and only $N_2$ is supplied by controlling the decomposition gas, or the decomposition gas of $NF_3$ is supplied together with the $N_2$ plasma to induce a reaction with ammonia.

Accordingly, the production of ammonium chloride may be inhibited or the generated ammonium chloride may be decomposed into a gas in the form of $NH_4F$.

FIG. 14 is a table for explaining the performance of exhaust gas treatment apparatus according to an embodiment of the present inventive concept.

Referring to FIG. 14, it can be seen that exhaust gas treatment apparatus according to the present inventive concept has superior and remarkable effects compared to conventional methods.

The conventional technology is a non-contact method of applying microwave or ICP for $NF_3$ gas to $NF_3$ gas, indirect decomposition method is used, and power consumption increases due to the indirect decomposition method. On the other hand, in the present inventive concept, a direct decomposition method is used in which arc discharge is directly performed on $N_2$ gas to generate plasma and $NF_3$ gas is brought into contact with the generated plasma to generate decomposition gas. Therefore, high-density plasma can be generated by using low power and a large amount of decomposition gas can be generated.

That is, by suppressing the generation of ammonium chloride salt by decomposition gas as described above, productivity is improved by reducing the number of vacuum pump failures and reducing stop loss. Also, the PM (Preventive Maintenance) cycle can be extended.

In addition, the exterior portion 1321 and the differential pressure centering structure in the gas supplying unit 130 allow the components of the decomposition gas to be more uniformly supplied.

In addition, according to the exhaust gas decomposition apparatus of the present inventive concept, it is possible to overcome the capacity limitations of conventional microwave, ICP, and RF methods. That is, the conventional technology has handicap which is an increase in capacity, energy use, and operating cost due to an increase of gas consumption in the recent nano process. However, according to the exhaust gas treatment apparatus of the present inventive concept, the supply amount of decomposition gas is easily controlled so that it is possible to smoothly solve the increase of the amount of process gas used.

In addition, a method of supplying $NF_3$ to the reaction chamber 120 and decomposing $NF_3$ by $N_2$ plasma to generate decomposition gas is used instead of directly spraying $NF_3$ to the electrode of the plasma generating unit 110. Thus, the problem of shortening the life time of the electrodes in the plasma generating unit is resolved, and the life time of the electrodes of the plasma generating unit 110 can be extended. Of course, a material having strong corrosion resistance may be used for a reaction unit such as a reaction chamber.

The above description of the present inventive concept is for illustration, and those of ordinary skill in the art to which the present inventive concept pertains will understand that it can be easily modified into other specific forms without changing the subject matter or essential features of the present inventive concept. Therefore, it should be understood that the embodiments described above are illustrative in all respects and not restrictive. For example, each component described as a single type may be implemented in a dispersed form, and likewise components described as distributed may be implemented in a combined form.

The scope of the present inventive concept is indicated by the following claims, and all changes or modifications derived from the meaning and scope of the claims and equivalent concepts should be interpreted as being included in the scope of the present inventive concept.

The invention claimed is:

1. An exhaust gas treatment apparatus for processing an exhaust gas generated from a semiconductor process and directed to a vacuum pump, the apparatus comprising:
   a plasma generating unit for generating plasma;
   a reaction chamber in which perfluoride is decomposed by the plasma to generate decomposition gas; and
   a gas supplying unit for supplying the decomposition gas from the reaction chamber to a processing chamber in which the exhaust gas from the semiconductor process is introduced and treated exhaust gas is discharged to the vacuum pump, wherein the decomposition gas reacts with the exhaust gas in the processing chamber to suppress generation of salt in solid state by a component of the exhaust gas.

2. The apparatus of claim 1, wherein the plasma generated by the plasma generating unit is $N_2$ plasma by are plasma, wherein $NF_3$ as the perfluoride supplied to the reaction chamber is decomposed by the $N_2$ plasma to generate the decomposition gas containing $N_2$, $NF_3$ or $F^-$, wherein the decomposition gas supplied to the processing chamber reacts with $NH_3$ of the exhaust gas or generated $NH_4Cl$ to form gaseous $NH_4F$ so that forming of solid $NH_4Cl$ is suppressed.

3. The apparatus of claim 2, wherein the gas supplying unit comprises, a connection pipe through which the decomposition gas from the reaction chamber is moved; and a gas injecting unit disposed between the connection pipe and the processing chamber, and injecting the decomposition gas into the processing chamber.

4. The apparatus of claim 3, wherein the gas injection unit includes, an exterior portion having one end coupled to the connection pipe; and a differential pressure centering ring coupled to the other end of the exterior portion, provided inside the connection pipe and spaced apart from an inner surface of the connection pipe, and injecting the decomposition gas into the processing chamber by a pressure difference between the connection pipe and the processing chamber.

5. The apparatus of claim 4, wherein the decomposition gas has uniformity by vortex caused by a space between the differential pressure centering ring and the inner surface of the connection pipe, and flows into the differential pressure centering ring.

6. The apparatus of claim 3, wherein the $NF_3$ gas is supplied to the reaction chamber rather than between anode and cathode generating the arc plasma, so that the lifetime of the anode and the cathode is improved.

7. The apparatus of claim 2, wherein the exhaust gas forms ammonium chloride salt due to Reaction Formula 1, and the generation of the ammonium chloride salt in solid state is suppressed due to Reaction Formula 2 and Reaction Formula 3 in the processing chamber $$6TiCl_4 + 20NH_3 \rightarrow 6TiN + N_2 + 12HCl + 12NH_4Cl \quad \text{[reaction formula 1]}$$

$$TiCl_4 + 4NH_3 + 3F \rightarrow TiN + 3NH_4F + 2Cl_2 \quad \text{[reaction formula 2]}$$

$$8NH_4Cl + 6F \rightarrow 6NH_4F + 8HCl + N_2 \quad \text{[reaction formula 3]}.$$

8. The apparatus of claim 3, further comprises control unit for controlling a supply amount and component of the decomposition gas by controlling supply amount of the $N_2$ plasma and supply amount of the $NF_3$ gas.

* * * * *